United States Patent [19]

Hieda et al.

[11] Patent Number: 4,979,014
[45] Date of Patent: Dec. 18, 1990

[54] MOS TRANSISTOR

[75] Inventors: Katsuhiko Hieda, Yokohama; Fumio Horiguchi; Hidehiro Watanabe, both of Kawasaki, all of Japan

[73] Assignee: Kabushiki Kaisha Toshiba, Kawasaki, Japan

[21] Appl. No.: 228,519

[22] Filed: Aug. 5, 1988

[30] Foreign Application Priority Data

Aug. 10, 1987 [JP] Japan ................... 62-198102

[51] Int. Cl.$^5$ .................. H01L 29/06; H01L 27/01; H01L 27/02
[52] U.S. Cl. .................... 357/56; 357/23.7; 357/55; 357/47
[58] Field of Search ............ 357/56, 23.7, 55, 47

[56] References Cited

U.S. PATENT DOCUMENTS

| | | | |
|---|---|---|---|
| 4,015,279 | 3/1977 | Ham | 357/56 |
| 4,054,894 | 10/1977 | Heagerty et al. | 357/56 |
| 4,797,718 | 1/1989 | Schubert | 357/56 |

FOREIGN PATENT DOCUMENTS

| | | | |
|---|---|---|---|
| 59-86241 | 5/1984 | Japan . | |
| 91964 | 5/1986 | Japan | 357/56 |

Primary Examiner—Rolf Hille
Assistant Examiner—Robert P. Limanek
Attorney, Agent, or Firm—Oblon, Fisher, McClelland, Maier & Neustadt

[57] ABSTRACT

An MOS transistor comprises a projection formed on the surface of a semiconductor substrate, a gate insulating film having an upper portion located on the upper surface of the projection and a pair of side portions extending from the upper portion and located on the side surfaces of the projection, source and drain regions located in the projection to sandwich the gate insulating film and to be exposed on the upper surface of the projection, and a gate electrode, having first and second portions respectively formed on the upper and side portions of the gate insulating film, for generating a depletion layer extending deeper into the projection than would a depletion layer generated by only the first portion, in the portion of the projection facing the first portion.

11 Claims, 5 Drawing Sheets

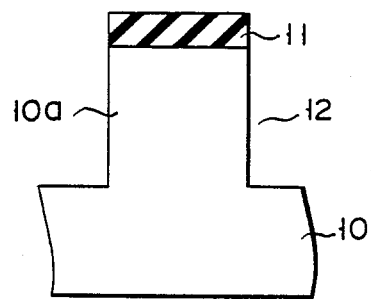
F I G. 1A
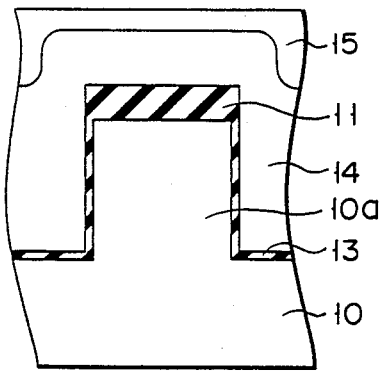
F I G. 1B
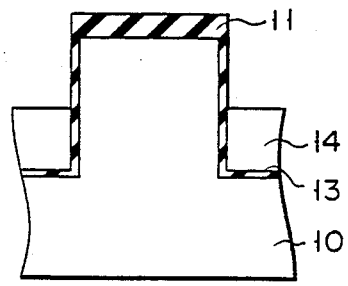
F I G. 1C
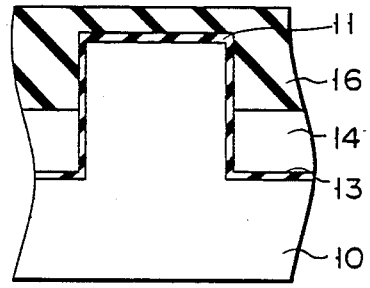
F I G. 1D
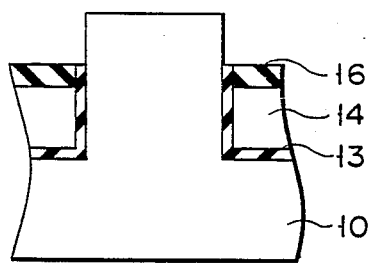
F I G. 1E

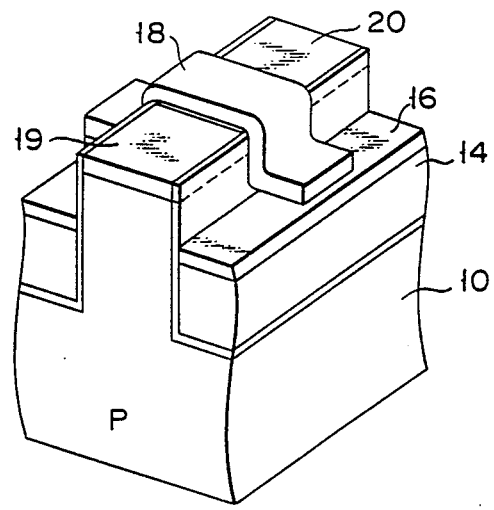
F I G. 1F
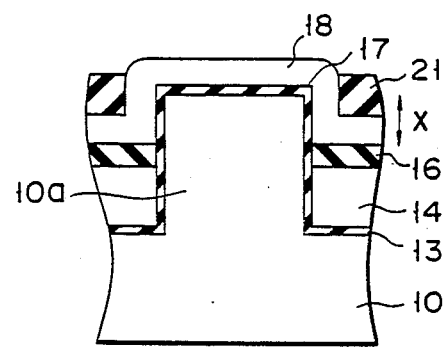
F I G. 1G
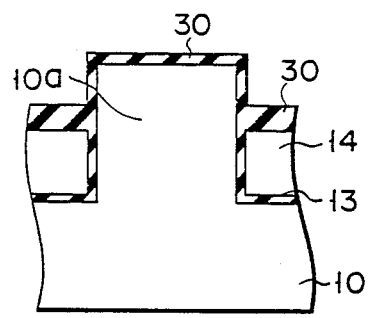
F I G. 2A
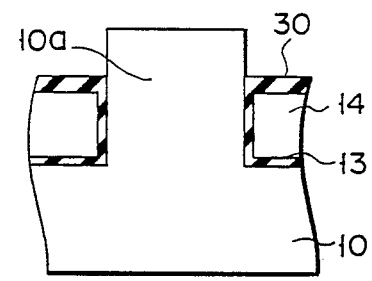
F I G. 2B

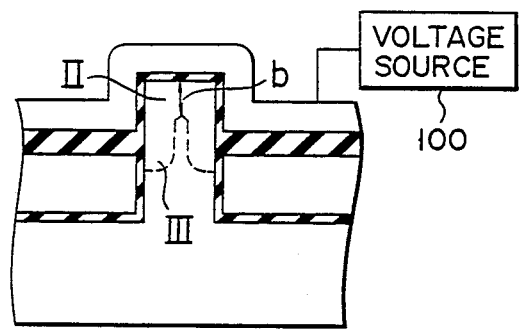
F I G. 4A
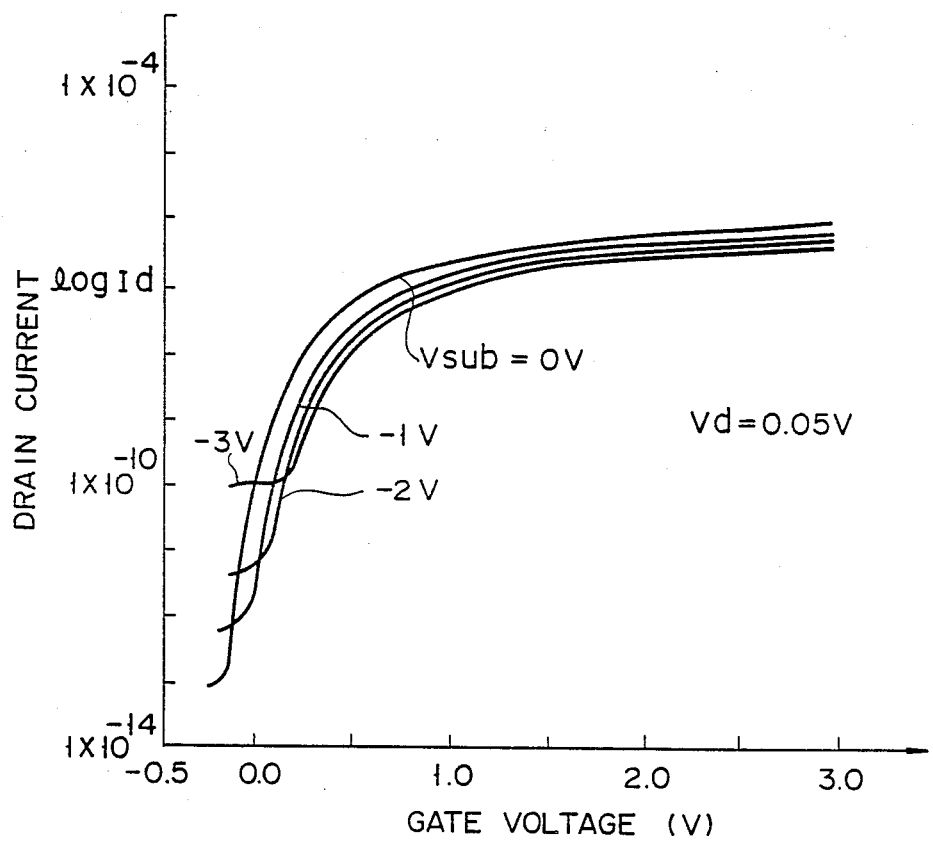
F I G. 4B

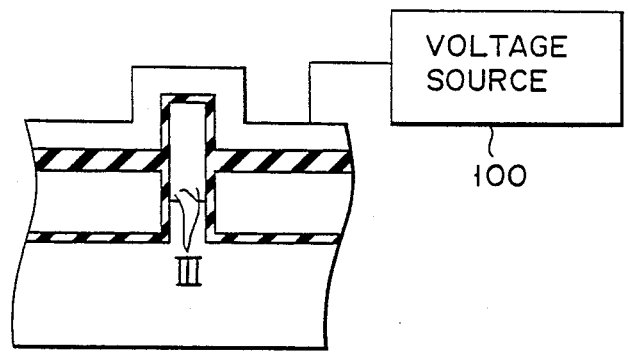
F I G. 5A
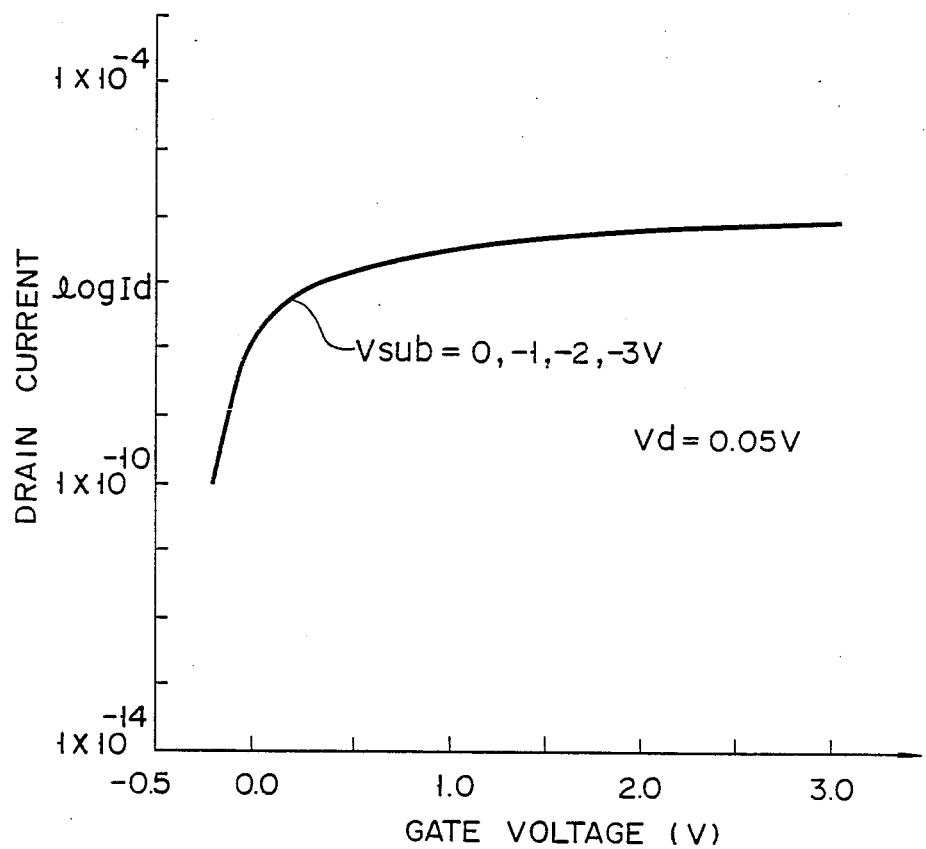
F I G. 5B

MOS TRANSISTOR

BACKGROUND OF THE INVENTION

1. Field of the Invention

The present invention relates to a semiconductor device and, more particularly, to an MOS transistor.

2. Description of the Related Art

In a conventional MOS integrated circuit, a thick insulating film is formed on a so-called field region between elements in order to eliminate an insulation failure due to a parasitic channel and reduce the parasitic capacitance of wiring.

As a typical method of forming such a film, the selective oxidation technique is employed In this method, a silicon nitride film is formed on a flat surface of a silicon wafer through a thin silicon oxide film, and the silicon wafer is oxidized using the silicon nitride film as a mask, thereby selectively forming a thick oxide film According to another known technique, a groove is formed in the field region of a wafer by etching, and a silicon oxide film or the like is flatly buried in the groove by a CVD method.

Even these conventional techniques, however, have various problems to be solved.

For example, when an MOS transistor incorporated in an LSI is to be operated, the substrate potential may be changed because of noise, or the source potential may be changed due to charging/discharging of a load capacity or the like. As a result, the threshold voltage of the MOS transistor is shifted. If the source voltage of, e.g., an n-channel transistor is changed in the positive direction, an equivalent negative substrate potential is practically applied to the n-channel transistor.

Such a problem degrades the current supply capacity of an MOS transistor or decreases the switching speed, thus adversely affecting the circuit operation.

Therefore, a demand has arisen for a device having an excellent cutoff characteristic, i.e., having a drain current which rises steeply in response to changes in gate voltage As described above, in the conventional techniques, a threshold voltage is easily changed in response to changes in substrate bias or the like, and a device having an excellent cutoff characteristic cannot be obtained.

SUMMARY OF THE INVENTION

It is an object of the present invention to provide an MOS transistor having a stable threshold with respect to changes in substrate bias or the like

BRIEF DESCRIPTION OF THE DRAWINGS

FIGS. 1A to 1G are views showing a method of manufacturing an MOS transistor according to an embodiment of the present invention in the order of steps, in which only FIG. 1F is a perspective view;

FIGS. 2A and 2B are views showing the steps of another manufacturing method;

FIGS. 3A and 3B are views illustrating a comparative MOS transistor so as to explain an operation and effects of the MOS transistor of the present invention, in which FIG. 3A shows the element and FIG. 3B shows the gate voltage-to-drain current characteristic of this element;

FIGS. 4A to 4B are views for explaining the operation and effects of the MOS transistor of the present invention, in which FIG. 4A shows the element and FIG. 4B shows the gate voltage-to-drain current characteristic of this element; and FIGS. 5A and 5B are views for explaining an operation and effects of an MOS transistor according to another embodiment of the present invention, in which FIG. 5A shows the element and FIG. 5B shows the gate voltage-to-drain current characteristic of this element.

DETAILED DESCRIPTION OF THE EMBODIMENTS

Figure 3A:
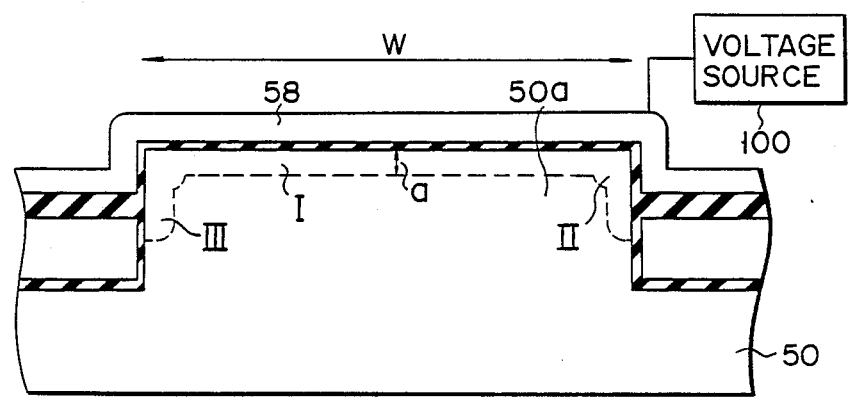

Semiconductor devices according to embodiments of the present invention will be described below in accordance with their manufacturing methods with reference to the accompanying drawings.

P-type silicon substrate 10 having a predetermined impurity concentration of, e.g., $2 \times 10^{16}$ cm$^{-3}$ is prepared. Then, silicon oxide film 11 having a thickness of about 5,000 Å is formed on the flat upper surface of silicon substrate 10 by a CVD method. As shown in FIG. 1A, oxide film 11 and silicon substrate 10 are partially and selectively etched by reactive ion etching (RIE) to form a rectangular groove 12 of a frame shape surrounding an MOS transistor region and having a depth of about 1.2 μm in an element isolation region. In this figure, two groove portions of groove 12 are shown, which parallelly extend with a predetermined distance in a channel width kept therebetween. Projection 10a is defined between these groove portions. Projection 10a has a pair of side surfaces opposing each other and extends in one direction (perpendicular to the surface of the drawing). Each side surface of projection 10a is perpendicular to the bottom surface of groove 12, i.e., the major surface of the substrate. Subsequently, boron is ion-implanted in a region (prospective field region) of semiconductor substrate 10 under the bottom surface of groove 12 as needed to form a field inversion preventive p$^+$-type layer (not shown).

The inner surface of groove 12, i.e., the side surface of the projection, is etched to a depth of 100 Å using an etching solution containing an alkali solution to remove a damaged layer generated by the RIE process Then, oxide film 13 having a thickness of about 500 Å is formed by thermal oxidation on the portion from which the damaged layer is removed. Phosphorus-doped polysilicon film or conductive layer 14 having a thickness of about 8,000 Å is formed on oxide films 11 and 13 by a CVD method. Since a difference in level is caused on the surface of polysilicon film 14 because of groove 12, resist 15 is coated on the surface of film 14, to flatten the upper surface.

A laminate layer (a composite layer of polysilicon film 14 and resist 15) is etched to an intermediate level along the depth of groove 12 in an atmosphere containing Freon gas and oxygen which are mixed to adjust the etching conditions such that the etching rates of resist 15 and polysilicon film 14 are equal to each other. As shown in FIG. 1C, resist 15 is removed by this etching, so that the upper surface of polysilicon film 14 is exposed at a level of about half the depth of groove 12.

Silicon oxide film 16 is deposited on oxide film 11 and polysilicon film 14 by a CVD method. A resist is coated on the resultant structure to flatten its surface. As shown in FIG. 1D, a laminate layer (a composite layer of the resist and silicon oxide film 16) is dry-etched to a level close to the upper surface of projection 10a in an atmosphere wherein the etching rates of the resist and silicon oxide film 16 are adjusted to be equal to each other, in the same manner as described above.

As shown in FIG. 1E, an upper portion of silicon oxide film 16 and part of oxide film 11 covered therewith are removed by an etchant such as ammonium fluoride. As a result, the thickness of silicon oxide film 16 becomes about 2,000 Å, and the upper surface and upper side surface of projection 10a are exposed.

Gate oxide film 17 having a thickness of about 150 Å is deposited on the exposed surfaces of projection 10a. In addition, phosphorus-doped polysilicon film 18 is deposited on oxide film 17 by a CVD method. Polysilicon film 18 is patterned such that both the side portions of polysilicon film 18 along one direction and part of underlying oxide film 17 are removed so as to leave their central portions, thereby forming a gate electrode. As a result, this gate electrode has upper and side portions respectively opposing the upper and side surfaces of the projection.

Phosphorus or arsenic is ion-implanted from above projection 10a to form $N^+$-type source and drain regions 19 and 20 exposed on the upper surface of projection 10 so as to sandwich the gate electrode, as shown in FIG. 1F. Thereafter, silicon oxide film 21 is formed on the upper surface of the element by a CVD method Silicon oxide film 21 is buried in the recess of the upper surface of the element by etching-back technics to flatten the surface of the element, as shown in FIG. 1G. An oxide film is formed on the resultant structure by a CVD method. Then, contact holes, which reach the source and drain regions, and the gate electrode, respectively, are formed in the oxide film. Finally, Al-wiring is performed to complete a semiconductor device.

Although the height (channel width: X) of portion of the side surface of projection 10a covered with oxide film 17 is preferably double the thickness of the gate electrode (polysilicon film 18) in order to prevent excessive overetching of the gate portion, the present invention is not limited to this arrangement.

A modification of the above-described method will be described with reference to FIGS. 2A and 2B.

According to the above-described method, as shown in FIG. 1C, after polysilicon film 14 is formed, the exposed portions of oxide films 11 and 13 are removed, thereby exposing the upper portion and upper side surfaces of projection 10a. Then, the resultant structure is thermally oxidized (wet oxidation) in an atmosphere containing steam at 850° to form oxide film 30 having a thickness of about 2,500 Å on polysilicon film 14 and a thickness of about 400 Å on the exposed portions of the projection, as shown in FIG. 2A.

Subsequently, the oxide film is etched such that an oxide film having a thickness of about 2,000 Å is left on polysilicon film 14. That is, the planar surface or the upper and side surfaces of the upper portion (element formation region) of projection 10a are exposed. Thereafter, the process shown after FIG. 1F is performed to manufacture a semiconductor device.

An operation, characteristics, and effects of the semiconductor device with the above-described arrangement will be described with reference to a comparative example.

Figure 3B:
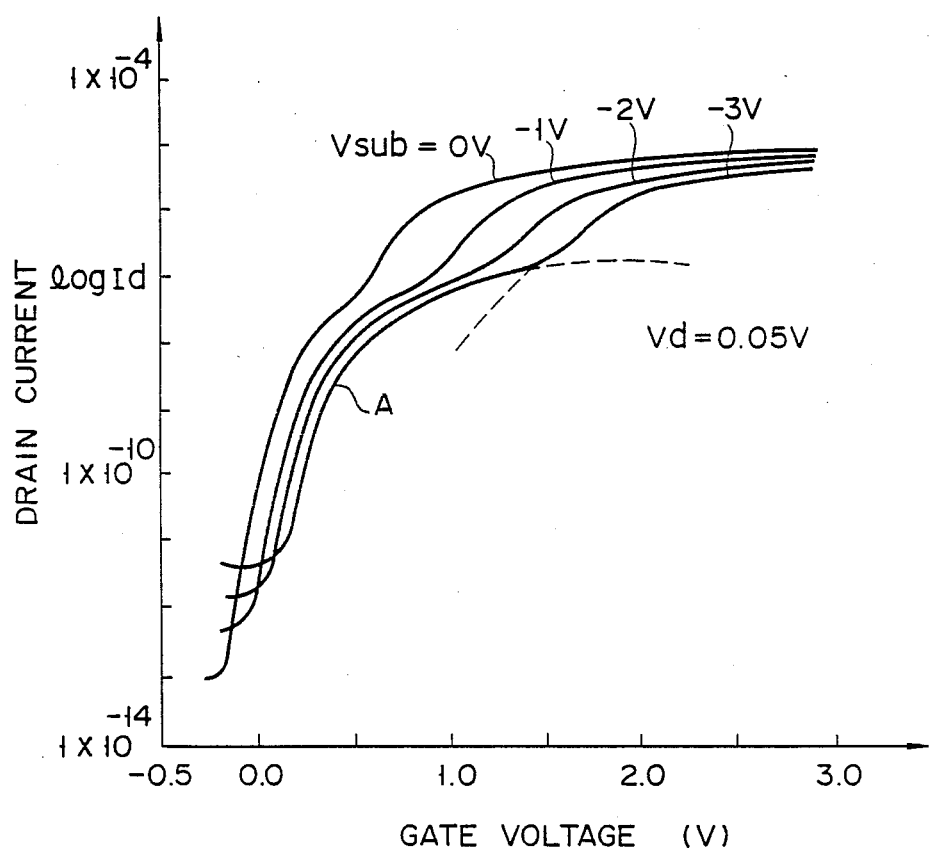

FIG. 3A shows a semiconductor as the comparative example, in which a state of a depletion layer is illustrated when the threshold voltage is applied to the gate electrode. FIG. 3B shows the characteristic curves of this comparative device.

Referring to FIG. 3A, reference numeral 50 denotes a silicon substrate; 50a, a projection of the silicon substrate; and 58, a gate electrode. In this embodiment, channel width W is set to be 10 $\mu\mu$m. FIG. 3B shows the characteristic of gate voltage Vg vs. drain voltage Id in a triode performance range when substrate potential (substrate bias) Vsub is sequentially shifted from 0 V $-1$ V, $-2$ V, and $-3$ V. In the measurement, drain voltage Vd and the source voltage are respectively set to be 0.05 V and 0 V.

The depletion layer generated in this device can be divided into first depletion layer I near the upper surface of the substrate, second depletion layers II in its corners, and third depletion layers III in its side portions. When the substrate bias is changed, the state between these depletion layers is greatly changed. As a result, the drain current with respect to the gate voltage is greatly changed, as shown in FIG. 3B, thus causing variation in threshold voltage. In addition, a kink appears due to a corner transistor, as indicated by reference symbol A.

FIGS. 4A and 4B show a device according to the present invention. FIGS. 4A and 4B correspond to FIGS. 3A and 3B, respectively. In this embodiment, channel width W is set to be 0.8 $\mu$m. In this embodiment, second depletion layers extending from corner portions of the gate electrode upon application of a gate voltage $V_G$ from power source 100 for a gate voltage are connected to each other or overlap each other. As a result, depth b of a depletion layer in a channel central portion in the widthwise direction of the gate becomes larger than the depth when the gate electrode is formed on only an element region (corresponding to depth a in FIG. 3A). In this state, since the influences of the second depletion layers are predominant, the influences of the substrate bias can be decreased. For this reason, the characteristics shown in FIG. 4B can be obtained.

FIGS. 5A and 5B show a device according to the present invention. FIGS. 5A and 5B correspond to FIGS. 4A and 4B, respectively. In this embodiment, channel width W is set to be 0.4 $\mu$m. In this device, since third depletion layers extending from its side portions overlap each other, the influences of the substrate bias is not observed. For this reason, as shown in FIG. 5B, even if the substrate bias is changed, the characteristics of this device are not changed In the devices shown in FIGS. 4A and 5A, excellent cutoff characteristics can be obtained. In addition, hot electrons generated by a high electric field near the drain region are trapped in the gate insulating film, and the channel width is actually widened. Therefore, the problem that the characteristics are changed can be solved because the electric field near the drain region is weakened An operation and effects of an MOS transistor according to the present invention will be described below.

A relatively strong electric field is generated in the corner portions of the projection by the gate electrode formed over the upper and side surfaces of the projection. As a result, depletion layers each having a large size, i.e., extending far, are generated around the corner portions compared with those in the flat portion (side and upper portions). When a channel width is determined so that the depletion layers extending from both the corner portions, which are separated from each other in the channel widthwise direction, are connected to each other or overlap each other, the depth of the depletion layer in the channel central portion in the gate widthwise direction becomes larger than that when the gate electrode is formed on only the upper surface of the projection. In this state, the transistor characteristics are predominantly determined by a corner transistor defined by the above corner portions. The corner transistor characteristics are not influenced by the substrate bias because the influences of the gate are larger and the electric field of the channel portion is stronger than that of a transistor formed on the flat portion. In the element having such a structure, excellent cutoff characteristics can be obtained because the drain current is greatly changed in response to changes in voltage applied to the gate electrode.

In this invention, polysilicon film 14 may be electrically floating type or may be applied with an earth bias or negative bias. In the former case, film 14 may be made by undoped polysilicon.

What is claimed is:

1. An MOS transistor comprising:
   a semiconductor substrate having a projection and a first conductivity type on a major surface thereof, said projection having an upper surface and opposite side surfaces substantially perpendicular to said upper surface;
   a gate insulating film formed on said upper and side surfaces of said projection;
   source and drain regions formed on the upper surface of said projection and separated from each other while sandwiching said gate insulating film, said source and drain regions having a second conductivity type;
   a gate electrode formed on said gate insulating film and having an upper portion opposing the upper surface of said projection, a pair of opposite side portions opposing the pair of side surfaces of said projection, and corner portions located between the side and upper portions; and
   means for applying a voltage to said gate electrode to form adjacent said upper portion a depletion layer extending a first depth into said projection from said upper portion and to form depletion layers extending from said corner portions and connected to each other in said projection at a second depth greater than said first depth.

2. A transistor according to claim 1, wherein the second portion of said gate electrode comprises an end portion located at an intermediate level of the side surface of said projection.

3. A transistor according to claim 2, further comprising an isolation layer formed on said substrate, located between said substrate and the second portion of said gate electrode.

4. An MOS transistor comprising:
   a substrate having a main surface;
   a projection formed on the main surface of said substrate and having an upper surface and a pair of opposite side surfaces;
   a gate insulating film having an upper portion located on the upper surface of said projection and a pair of side portions extending from the upper portion and located on the side surfaces of said projection;
   source and drain regions located in said projection to sandwich said gate insulating film and to be exposed on the upper surface of said projection;
   a gate electrode, having first and second portions respectively formed on the upper and side portions of said gate insulating film, for generating a depletion layer extending closer to said substrate than a depletion layer generated by only the first portion, in the portion of the projection facing the first portion; and
   a polysilicon layer formed on said substrate, located between said substrate and the second portion of said gate electrode, and electrically insulated from said gate electrode;
   wherein the second portion of said gate electrode comprises an end portion located at an intermediate level of the side surface of said projection, and the side and upper surface of the projection intersect at substantially right angles.

5. A transistor according to claim 4, wherein the side surfaces of said projection extend parallel to each other.

6. A transistor according to claim 5, wherein the side surfaces of said projection are separated from each other at a maximum distance of 0.8 $\mu$m.

7. A transistor according to claim 6, wherein said gate electrode comprises another side portion extending from the side portion thereof to be substantially parallel to the major surface of said semiconductor substrate, and an insulating film, located between said another side portion and the major surface of said semiconductor substrate, for electrically insulating the conductive layer from said another side portion.

8. An MOS transistor comprising:
   a substrate having a main surface;
   a projection formed on the main surface of said substrate and having an upper surface and a pair of opposite side surfaces;
   a gate insulating film having an upper portion located on the upper surface of said projection and a pair of side portions extending from the upper portion and located on the side surfaces of said projection;
   source and drain regions located in said projection to sandwich said gate insulating film and to be exposed on the upper surface of said projection;
   a gate electrode, having first and second portions respectively formed on the upper and side portions of said gate insulating film, for generating a depletion layer extending closer to said substrate than a depletion layer generated by only the first portion, in the portion of the projection facing the first portion; and
   an isolation layer formed on said substrate, located between said substrate and the second portion of said gate electrode;
   wherein the second portion of said gate electrode comprises an end portion located at an intermediate level of the side surface of said projection, and said isolation layer includes a thin insulating layer and a thick layer which are laminated with each other, the thin layer provided between the end portion of the second portion of the gate electrode and the thick layer to electrically insulate the thick layer from the gate electrode.

9. A transistor according to claim 8, wherein said isolation layer includes another thin insulating layer between the thick layer and the substrate.

10. A transistor according to claim 9, wherein said thick layer is made of insulating or conductive material.

11. A transistor according to claim 10, wherein said thick layer includes a polysilicon layer.

* * * * *